United States Patent
Morii et al.

(10) Patent No.: US 10,778,209 B1
(45) Date of Patent: Sep. 15, 2020

(54) PIN DIODE DRIVING CIRCUIT AND THRESHOLD VALUE DETERMINATION METHOD

(71) Applicant: DAIHEN Corporation, Osaka-shi, Osaka (JP)

(72) Inventors: Tatsuya Morii, Osaka (JP); Yohei Kaneyama, Osaka (JP); Masayuki Nakahama, Osaka (JP)

(73) Assignee: DAIHEN Corporation, Osaka-shi, Osaka (JP)

( * ) Notice: Subject to any disclaimer, the term of this patent is extended or adjusted under 35 U.S.C. 154(b) by 0 days.

(21) Appl. No.: 16/812,800

(22) Filed: Mar. 9, 2020

(30) Foreign Application Priority Data

Mar. 26, 2019  (JP) ................................ 2019-059158

(51) Int. Cl.
H03K 17/04 (2006.01)
H03K 17/0412 (2006.01)
H03K 17/74 (2006.01)
H01L 29/868 (2006.01)

(52) U.S. Cl.
CPC ..... *H03K 17/04123* (2013.01); *H01L 29/868* (2013.01); *H03K 17/74* (2013.01)

(58) Field of Classification Search
None
See application file for complete search history.

(56) References Cited

U.S. PATENT DOCUMENTS

| | | | | |
|---|---|---|---|---|
| 2,864,007 A | * | 12/1958 | Clapper | H03K 3/286 327/385 |
| 3,160,766 A | * | 12/1964 | Reymond | H03K 17/667 327/375 |
| 3,175,100 A | * | 3/1965 | La Mothe | H03K 17/663 327/403 |
| 3,244,910 A | * | 4/1966 | Leifer | H03K 17/667 327/486 |
| 3,515,906 A | * | 6/1970 | Geller | H03K 17/667 327/423 |

(Continued)

FOREIGN PATENT DOCUMENTS

| | | |
|---|---|---|
| JP | S58-106902 A | 6/1983 |
| JP | H4-200012 A | 7/1992 |

(Continued)

OTHER PUBLICATIONS

English Translation of International Search Report for PCT Application No. PCT/JP2017/041328 dated Feb. 6, 2018, 2 pages.

*Primary Examiner* — Lincoln D Donovan
*Assistant Examiner* — Khareem E Almo
(74) *Attorney, Agent, or Firm* — Bret E. Field; Bozicevic, Field & Francis LLP

(57) ABSTRACT

In a PIN diode drive circuit, a forward voltage is applied to a PIN diode through a first switching element and a reverse voltage is applied to the PIN diode through a second switching element. A limiting unit limits an increase rate of an absolute value of a reverse recovery current to a value smaller than a threshold value, the reverse recovery current flowing through the PIN diode when a voltage applied to the PIN diode changes from a forward voltage to a reverse voltage. The threshold value is less than 1 time and 0.5 times or more of a maximum value of the increase rate when a second peak appears regarding the reverse recovery current.

6 Claims, 8 Drawing Sheets

(56) References Cited

U.S. PATENT DOCUMENTS

| | | | | |
|---|---|---|---|---|
| 3,562,557 | A * | 2/1971 | Gates | G01R 13/26 |
| | | | | 327/111 |
| 3,683,208 | A * | 8/1972 | Burens | H02M 7/537 |
| | | | | 323/312 |
| 3,748,497 | A * | 7/1973 | Woods | B61L 3/08 |
| | | | | 327/413 |
| 4,038,607 | A * | 7/1977 | Schade, Jr. | H03F 1/308 |
| | | | | 330/264 |
| 4,042,842 | A * | 8/1977 | Hegendorfer | G06G 7/184 |
| | | | | 327/344 |
| 4,103,245 | A * | 7/1978 | Yokoyama | H01L 29/08 |
| | | | | 257/E29.029 |
| 4,253,035 | A * | 2/1981 | Amitay | H03K 17/667 |
| | | | | 326/129 |
| 4,412,141 | A * | 10/1983 | Jacobsen | H03K 17/667 |
| | | | | 327/532 |
| 4,419,593 | A * | 12/1983 | Butler | H03K 5/12 |
| | | | | 326/21 |
| 4,533,838 | A | 8/1985 | Fujita | |
| 4,617,482 | A * | 10/1986 | Matsuda | H03K 19/00315 |
| | | | | 257/358 |
| 4,837,457 | A * | 6/1989 | Bergstrom | H03K 4/64 |
| | | | | 327/482 |
| 4,922,139 | A * | 5/1990 | Giebel | H03L 7/0895 |
| | | | | 327/2 |
| 4,937,470 | A * | 6/1990 | Zeiler | H02M 1/38 |
| | | | | 323/289 |
| 4,987,381 | A * | 1/1991 | Butler | H03F 1/3217 |
| | | | | 330/255 |
| 5,747,872 | A | 5/1998 | Lutz et al. | |
| 6,154,069 | A * | 11/2000 | Ebihara | G09G 3/3696 |
| | | | | 327/111 |
| 6,373,297 | B1 * | 4/2002 | Lee | H03K 17/04123 |
| | | | | 327/108 |
| 6,677,828 | B1 | 1/2004 | Harnett et al. | |
| 6,703,883 | B2 * | 3/2004 | West | G06F 1/04 |
| | | | | 327/108 |
| 7,023,246 | B2 * | 4/2006 | Scollo | H03K 17/04213 |
| | | | | 327/108 |
| 7,053,678 | B2 * | 5/2006 | Scollo | H03K 17/04126 |
| | | | | 327/108 |
| 7,251,121 | B2 | 7/2007 | Bhutta | |
| 7,298,128 | B2 | 11/2007 | Bhutta | |
| 7,405,732 | B2 * | 7/2008 | Kinjo | G09G 3/3611 |
| | | | | 345/211 |
| 7,454,141 | B2 * | 11/2008 | Farmer | H04N 7/22 |
| | | | | 398/70 |
| 7,767,433 | B2 * | 8/2010 | Kuthi | C12M 35/02 |
| | | | | 435/173.6 |
| 7,852,127 | B2 * | 12/2010 | Kitazawa | B41J 2/0452 |
| | | | | 327/111 |
| 7,880,515 | B2 * | 2/2011 | Kitazawa | B41J 2/0452 |
| | | | | 327/111 |
| 7,965,127 | B2 * | 6/2011 | Svensson | H03K 17/163 |
| | | | | 326/21 |
| 9,196,459 | B2 | 11/2015 | Bhutta | |
| 9,306,533 | B1 | 4/2016 | Mavretic | |
| 9,345,122 | B2 | 5/2016 | Bhutta | |
| 9,496,122 | B1 | 11/2016 | Bhutta | |
| 9,525,412 | B2 | 12/2016 | Mavretic | |
| 9,543,122 | B2 | 1/2017 | Bhutta | |
| 9,584,090 | B2 | 2/2017 | Mavretic | |
| 9,591,739 | B2 | 3/2017 | Bhutta | |
| 9,697,991 | B2 | 7/2017 | Bhutta | |
| 9,728,378 | B2 | 8/2017 | Bhutta et al. | |
| 9,729,122 | B2 | 8/2017 | Mavretic | |
| 9,745,660 | B2 | 8/2017 | Bhutta | |
| 9,755,641 | B1 | 9/2017 | Bhutta | |
| 9,762,190 | B2 * | 9/2017 | Li | H03F 3/3022 |
| 9,843,318 | B2 * | 12/2017 | Hayashi | H03K 17/08128 |
| 9,844,127 | B2 | 12/2017 | Bhutta | |
| 10,026,594 | B2 | 7/2018 | Bhutta | |
| 10,217,608 | B2 | 2/2019 | Mavretic | |
| 10,340,879 | B2 | 7/2019 | Mavretic et al. | |
| 10,431,424 | B2 | 10/2019 | Mavretic et al. | |
| 10,431,428 | B2 | 10/2019 | Bhutta et al. | |
| 10,454,453 | B2 | 10/2019 | Bhutta et al. | |
| 10,455,729 | B2 | 10/2019 | Bhutta | |
| 10,460,912 | B2 | 10/2019 | Bhutta et al. | |
| 10,483,090 | B2 | 11/2019 | Bhutta et al. | |
| 2012/0168081 | A1 | 7/2012 | Son | |
| 2013/0193308 | A1 * | 8/2013 | Cellek | H01L 31/1013 |
| | | | | 250/208.1 |
| 2016/0380610 | A1 | 12/2016 | Ulrich | |
| 2017/0178865 | A1 | 6/2017 | Ulrich | |
| 2017/0186473 | A1 * | 6/2017 | Ikeda | H01L 29/7869 |
| 2019/0172683 | A1 | 6/2019 | Mavretic et al. | |
| 2019/0267212 | A1 | 8/2019 | Mavretic | |
| 2019/0272978 | A1 | 9/2019 | Ahmed et al. | |
| 2019/0326094 | A1 | 10/2019 | Bhutta | |

FOREIGN PATENT DOCUMENTS

| | | |
|---|---|---|
| JP | H8-18072 A | 1/1996 |
| JP | 2002-164762 A | 6/2002 |
| JP | 2003-110407 A | 4/2003 |
| JP | 2010-103123 A | 5/2010 |
| JP | 2012-142285 A | 7/2012 |
| JP | 5050062 B2 | 7/2012 |

* cited by examiner

PIN DIODE DRIVING CIRCUIT AND THRESHOLD VALUE DETERMINATION METHOD

CROSS-REFERENCE TO RELATED APPLICATION

This Nonprovisional application claims priority under 35 U.S.C. § 119(a) on Patent Application No. 2019-059158 filed in Japan on Mar. 26, 2019, the entire contents of which are hereby incorporated by reference.

FIELD

The present disclosure relates to a PIN diode driving circuit, which is used in an impedance matching device for achieving impedance matching between a high frequency power supply and a load, and to a threshold value determination method.

BACKGROUND

Power is supplied from a high frequency power supply to a load such as a plasma processing apparatus. An impedance of the load changes. In this case, in order to efficiently supply high frequency power to the load, an impedance matching device for matching the impedance of the case where the load side is viewed from the high frequency power supply, with an output impedance of the high frequency power supply is used (refer to, for example, Japanese Patent Application Laid-Open No. 2012-142285).

The impedance matching device described in Japanese Patent Application Laid-Open No. 2012-142285 includes a variable capacitor and is provided between the high frequency power supply and the load. In a variable capacitor, a plurality of series circuits are connected in parallel. In each series circuit, a capacitor is connected in series to PIN (P-Intrinsic-N) diode. The impedance matching device disclosed in Japanese Patent Application Laid-Open No. 2012-142285 switches on or off the PIN diode based on a control signal of a controller so as to adjust the capacitance of the variable capacitor. Thereby, impedance matching is achieved.

As a method performed in the case of periodically modulating the amplitude of the high frequency power, there is a method of synchronizing the adjustment of the capacitance of the variable capacitor with a modulation period, for example. In order to switch on or off the PIN diode at high speed, a PIN diode driving circuit also needs to turn on or off the driving current at high speed. In the case of turning on or off the driving current of the PIN diode at high speed, a phenomenon has been observed in which the PIN diode breaks down despite that loss derating is performed using a PIN diode having a sufficient withstand voltage.

Japanese Patent Application Laid-Open No. H08-18072 discloses occurrence of a dynamic avalanche effect regarding a high speed power diode for a flywheel. The dynamic avalanche effect is a phenomenon in which elements are damaged due to steep commutation and a high intermediate circuit voltage.

According to the description of Japanese Patent Application Laid-Open No. H08-18072, after the maximum value of the reverse recovery current due to the commutation of the flywheel diode appears, the second maximum value caused by the dynamic avalanche appears.

SUMMARY

However, it has not been clarified whether or not above-described breakdown of the PIN diode used in the impedance matching device is caused by the dynamic avalanche effect described in Japanese Patent Application Laid-Open No. H08-18072. Regarding this breakdown, it is required to take reliable measures immediately.

The present disclosure has been made in view of such circumstances, and an object thereof is to provide a PIN diode driving circuit and a threshold value determination method capable of realizing a PIN diode drive without breaking down.

A PIN diode driver according to an aspect of the present disclosure includes: a first switching element through which a forward voltage is applied to a PIN diode; a second switching element through which a reverse voltage is applied to the PIN diode; and a limiting unit that limits an increase rate of an absolute value of a reverse recovery current to a value smaller than a threshold value, the reverse recovery current flowing through the PIN diode when a voltage applied to the PIN diode changes from a forward voltage to a reverse voltage by switching of the first switching element and the second switching element. The threshold value is less than 1 time and 0.5 times or more of a maximum value of the increase rate of a case where a second peak appears regarding the reverse recovery current.

According to this aspect, the reverse recovery current flows through the PIN diode when the voltage applied to the PIN diode changes from the forward voltage to the reverse voltage. The forward voltage is applied to the PIN diode through the first switching element. The reverse voltage is applied to the PIN diode through the second switching element. The increase rate of the absolute value of the reverse recovery current is limited to a value smaller than the threshold value determined within the range which is less than 1 time and 0.5 times or more of the maximum value of the increase rate of the case where the second peak appears after the peak appears regarding the reverse recovery current. Therefore, the increase rate of the absolute value of the reverse recovery current is suppressed to a value smaller than a value that causes the PIN diode to break down.

The PIN diode driver according to an aspect of the present disclosure further includes: a series circuit in which the first switching element is connected in series to a first resistor for limiting a forward current flowing through the PIN diode; and a low pass filter. One end of the series circuit is connected to one end of the second switching element. The low pass filter is provided between one end of the PIN diode and a connection node between the series circuit and the second switching element, and prevents a high frequency voltage, which is applied to the one end of the PIN diode from outside, from being applied to the first switching element and the second switching element.

According to this aspect, in the series circuit the first switching element is connected to a first resistor. The PIN diode is connected, through the low pas filter, to the connection node between the series circuit and the second switching element. Therefore, the forward current of the PIN diode is limited by the first resistor so that the accumulation of minority carrier is suppressed. In addition, the high frequency voltage applied to the first and second switching elements from the outside is suppressed.

In the PIN diode driver according to an aspect of the present disclosure, the second switching element is a transistor having an insulated gate. The limiting unit is a second resistor connected in series to a gate circuit of the transistor.

According to this aspect, the second resistor is connected in series to the gate circuit of the second switching element for applying a reverse voltage to the PIN diode. The increase rate of the absolute value of the reverse recovery current of the PIN diode is suppressed according to the magnitude of the resistance value of the second resistor. Therefore, the increase rate of the absolute value of the reverse recovery current can be easily adjusted.

In the PIN diode driver according to an aspect of the present disclosure, the low pass filter has transient characteristics limiting the increase rate to the value smaller than the threshold value. The limiting unit is the low pass filter.

According to this aspect, the increase rate of the absolute value of the reverse recovery current of the PIN diode is suppressed based on the quality of the transient characteristics of the low pass filter. Specifically, the increase rate of the absolute value of the reverse recovery current is reduced by lowering the cutoff frequency of the low pass filter, for example. Therefore, the increase rate of the absolute value of the reverse recovery current can be easily adjusted.

In the PIN diode driving circuit according to an aspect of the present disclosure, the limiting unit is a third resistor connected between one end of the series circuit and one end of the second switching element.

According to this aspect, the third resistor is connected between the second switching element and the series circuit including the first switching element and the first resistor. The PIN diode is connected, through the low pass filter, to the connection node between the third resistor and the series circuit including the first switching element and the first resistor. The increase rate of the absolute value of the reverse recovery current of the PIN diode is suppressed according to the magnitude of the resistance value of the third resistor. Therefore, the increase rate of the absolute value of the reverse recovery current can be easily adjusted.

A threshold value determination method according to an aspect of the present disclosure is a method for determining a threshold value of an increase rate of an absolute value of a reverse recovery current flowing through a PIN diode when a voltage applied to the PIN diode changes from a forward voltage to a reverse voltage. The threshold value determination method includes: connecting the PIN diode to an application circuit in which, in a case where a switching element having an insulate gate is turned on and off alternately, a reverse voltage is applied to the PIN diode through the switching element after a forward voltage is applied to the PIN diode; turning on and off the switching element alternately each time one of a plurality of resistors having different resistance values is connected in series to a gate circuit of the switching element; measuring a waveform of the reverse recovery current; and setting a value, which is less than 1 time and 0.5 times or more of a maximum value of the increase rate of a case where a second peak appears in the measured waveform, as the threshold value.

According to this aspect, the application circuit applies a forward voltage to the PIN diode and applies a reverse voltage to the PIN diode through the switching element. The PIN diode is connected to the application circuit. The switching element is turned on and off alternately each time resistors having different resistance values are individually connected to the gate circuit of the switching element one by one. Then, the waveform of the reverse recovery current is measured. Regarding the reverse recovery current of a case where the second peak appears in the measured waveform, a value that is less than 1 time and 0.5 times or more of the maximum value of the increase rate of the absolute value is set as the threshold value of the increase rate. Thereby, it is possible to calculate a threshold value for driving the PIN diode at high speed close to the limit speed which does not cause the PIN diode to break down.

According to the present disclosure, it is possible to realize the PIN diode drive without breaking down.

The above and further objects and features will move fully be apparent from the following detailed description with accompanying drawings.

DETAILED DESCRIPTION OF NON-LIMITING EXAMPLE EMBODIMENTS

Hereinafter, an impedance matching device according to the present disclosure will be described in detail with reference to the diagrams illustrating embodiments thereof.

Embodiment 1

Figure 1:
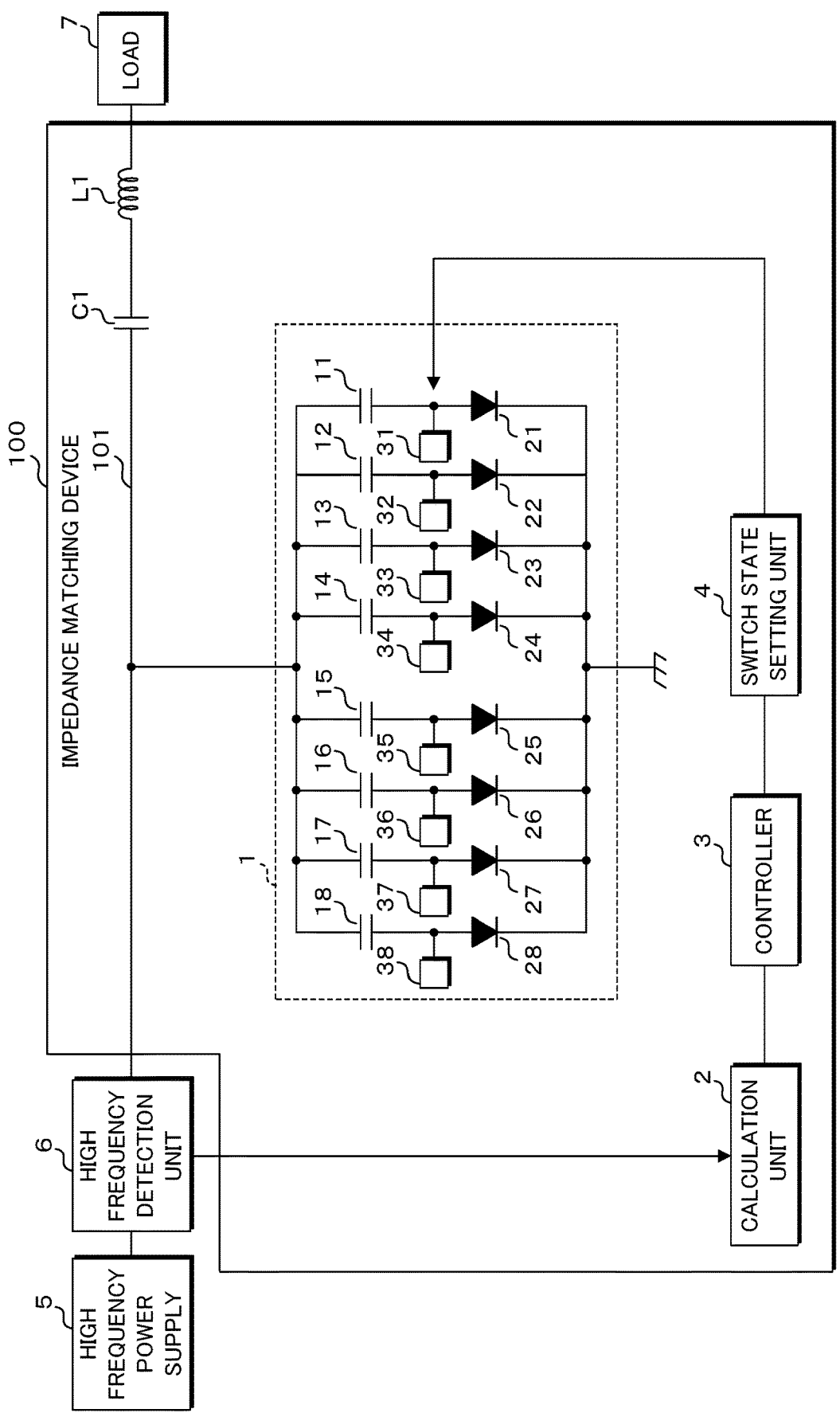
FIG. 1 is a block diagram illustrating a configuration example of an impedance matching device according to Embodiment 1.

FIG. 1 is a block diagram illustrating a configuration example of an impedance matching device 100 according to Embodiment 1. A high frequency power supply 5 outputs high frequency power. A load 7 consumes high frequency power. The impedance matching device 100 is provided between the high frequency power supply 5 and the load 7. A high frequency detection unit 6 is connected between the high frequency power supply 5 and the impedance matching device 100. The high frequency detection unit 6 allows high frequency power to pass therethrough and detects parameters, such as a high frequency voltage. Therefore, the high frequency detection unit 6 is interposed between an output end of the high frequency power supply 5 and an input end of the impedance matching device 100. The high frequency detection unit 6 may be included in the impedance matching device 100.

The high frequency power supply 5 is an AC (Alternating Current) power supply that outputs high frequency power of an industrial radio frequency (RF) band of 2 MHz, 13.56 MHz, 27 MHz, 60 MHz or the like, for example. The output impedance of the high frequency power supply 5 is set to a specified value, such as 50Ω, for example. The high frequency power supply 5 includes an inverter circuit (not illustrated), and generates high frequency AC power by controlling the switching of the inverter circuit.

Hereinafter, "of the case where the load 7 side is viewed from the output end of the high frequency power supply 5 or from the input end of the impedance matching device 100"

will be simply referred to as "of the case where the load 7 side is viewed" or "on the load 7 side". The input end of the impedance matching device 100 is a location equivalent to the output end of the high frequency power supply 5. The high frequency detection unit 6 detects parameters for calculating the impedance of the case where the load 7 side is viewed or parameters for calculating a reflection coefficient of the case where the load 7 side is viewed. The impedance of the case where the load 7 side is viewed is the combined impedance obtained by combining the impedance of the load 7 and the impedance of the impedance matching device 100. Specifically, the high frequency detection unit 6 detects, as parameters, a high frequency voltage, a high frequency current, and a phase difference between the high frequency voltage and the high frequency current at a position of the high frequency detection unit 6. Alternatively, the high frequency detection unit 6 detects, as parameters, high frequency traveling wave power (or a high frequency traveling wave voltage) toward the load 7 and reflected wave power (or a reflected wave voltage) which is reflected at the load 7 and returned from the load 7. Using these detected parameters, a calculation unit 2 described later calculates the impedance or the reflection coefficient on the load 7 side by a known method.

The load 7 performs various kinds of processing using high frequency power supplied from the high frequency power supply 5. The load 7 is, for example, a plasma processing apparatus or a non-contact power transmission apparatus. In the plasma processing apparatus, the plasma state changes from moment to moment with the progress of manufacturing processes, such as plasma etching and plasma CVD. As a result, the impedance of the load 7 changes.

The impedance matching device 100 includes: a variable capacitor 1 having a variable capacitance; the calculation unit 2 that acquires the above-described parameters from the high frequency detection unit 6 and calculates an impedance or a reflection coefficient on the load 7 side; and a controller 3 that controls the capacitance of the variable capacitor 1 using the impedance or the reflection coefficient calculated by the calculation unit 2. The variable capacitor 1 includes PIN diodes 21, 22, . . . , 28. The impedance matching device 100 further includes a switch state setting unit 4 for setting on or off the PIN diodes 21, 22, . . . , 28. The controller 3 controls the capacitance of the variable capacitor 1 through the switch state setting unit 4.

In the impedance matching device 100, a transmission line 101 extending to the high frequency detection unit 6 and a series circuit in which a capacitor C1 and an inductor L1 are connected in series are connected in cascade. One end of the capacitor C1 is connected to the load 7 through the inductor L1. The variable capacitor 1 is substantially a circuit having two ends. One end of the variable capacitor 1 is connected to the transmission line 101. The other end of the variable capacitor 1 is grounded. That is, the variable capacitor 1 and the series circuit including the capacitor C1 and the inductor L1 configure an L-type matching circuit. The capacitor C1 may be replaced with another variable capacitor 1.

Here, a case where the matching circuit is an L type has been described. However, the matching circuit may be an inverted L type, T type, or π type. In addition, the series circuit including the capacitor C1 and the inductor L1 may be connected to the outside of the impedance matching device 100 (that is, between the impedance matching device 100 and the load 7). Hereinafter, a portion where high frequency power is input from the high frequency detection unit 6 to the transmission line 101 will be referred to as an input portion. In addition, a portion where high frequency power is output from the inductor L1 to the load 7 will be referred to as an output portion.

The variable capacitor 1 includes capacitors 11, 12, . . . , 18, PIN diodes 21, 22, . . . , 28 and driving circuits 31, 32, . . . , 38. One end of each of capacitor 11, 12, . . . , 18 is connected to the transmission line 101. Anodes of PIN diodes 21, 22, . . . , 28 are connected to the other ends of the capacitors 11, 12, . . . , 18 respectively. Cathodes of the PIN diodes 21, 22, . . . , 28 are grounded. Output ends Et (refer to FIG. 2 described later) of the driving circuits 31, 32, . . . , 38 are connected to connection nodes between the capacitors 11, 12, . . . , 18 and the PIN diodes 21, 22, . . . , 28 respectively. The number of capacitors 11, 12, . . . , 18, the number of PIN diodes 21, 22, . . . , 28, and the number of driving circuits 31, 32, . . . , 38 are not limited to eight.

Figure 2:
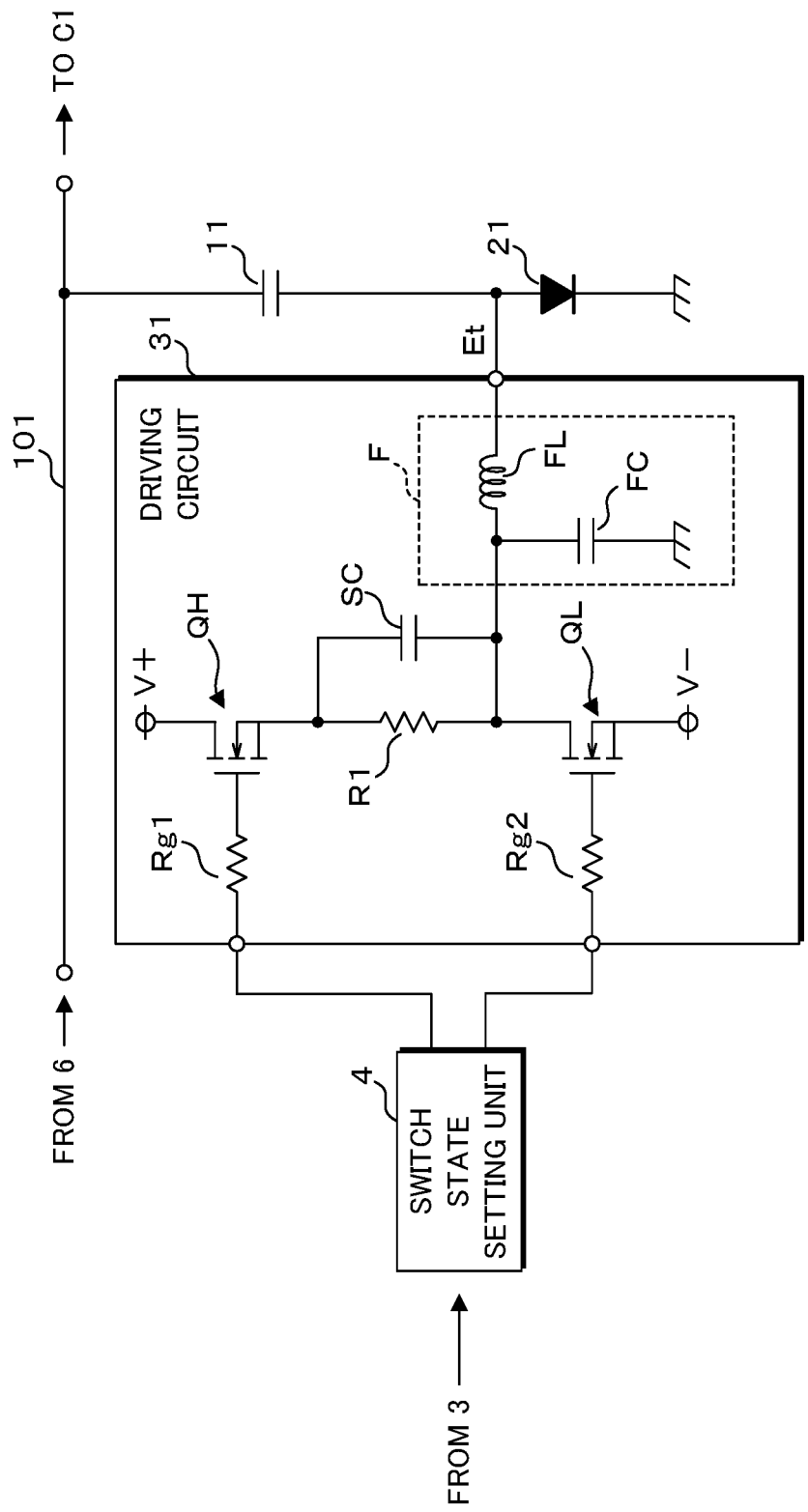
FIG. 2 is a circuit diagram illustrating a configuration example of a driving circuit according to Embodiment 1.

FIG. 2 is a circuit diagram illustrating a configuration example of the driving circuit 31 according to Embodiment 1. The configuration of each of the other driving circuits 32, 33, . . . , 38 is similar to the configuration of the driving circuit 31. Hereinafter, a metal oxide semiconductor field effect transistor (MOSFET) will be simply referred to as a transistor. The driving circuit 31 includes N-channel transistors QH and QL. Drain of the transistor QH is connected to a positive power supply V+. Source of the transistor QL is connected to a negative power supply V−. A resistor R1 is connected to a speed-up capacitor SC in parallel. The parallel circuit including a resistor R1 and a speed-up capacitor SC is connected between the source of the transistor QH and the drain of the transistor QL. The transistor QH (corresponding to a first switching element) and the transistor QL (corresponding to a second switching element) may be other switching elements, such as an insulated gate bipolar transistor (IGBT). The transistor QH and the parallel circuit including the resistor R1 (corresponding to a first resistor) and the speed-up capacitor SC is connected in series, in this order. The order of series connection of the transistor QH and the parallel circuit may be reversed.

The driving circuit 31 further includes an L-type filter F (corresponding to a low pass filter) including a capacitor FC and an inductor FL. One end of the capacitor FC is connected to the drain of the transistor QL. The other end of the capacitor FC is grounded. The inductor FL is connected between the drain of the transistor QL and the output end Et. Driving signals are applied to gate of the transistor QH and gate of the transistor QL from the switch state setting unit 4 through resistors Rg1 and Rg2, respectively. Each driving signal indicates high level and low level. Two driving signals indicates high level and low level complementarily. The resistor Rg2 corresponds to a second resistor. For example, the voltage of the high level indicated by the driving signal is equal to the voltage of the positive power supply V+. For example, the voltage of the low level indicated by the driving signal is equal to the voltage of the negative power supply V−.

In a case where a driving signal indicating a low level is applied to the gate of the transistor QL and a driving signal indicating high level is applied to the gate of the transistor QH, the transistor QL is turned off and the transistor QH is turned on. Then, a forward current flows from the positive power supply V+ to the PIN diode 21 through the transistor QH, the parallel circuit and the inductor FL included in the filter F. As described above, the parallel circuit includes the resistor R1 and the speed-up capacitor SC. In a case where the forward current flows, the PIN diode 21 is turned on. As a result, the capacitance of the capacitor 11 is included in the capacitance of the entire variable capacitor 1.

In a case where a driving signal indicating a low level is applied to the gate of the transistor QH and a driving signal indicating a high level is applied to the gate of the transistor QL, the transistor QH is turned off and the transistor QL is turned on. Then, a reverse voltage is applied from the negative power supply V− to the anode of the PIN diode 21 through the transistor QL and the inductor FL so that the PIN diode 21 is turned off. As a result, the capacitance of the capacitor 11 is not included in the capacitance of the entire variable capacitor 1. As described above, the capacitance of the variable capacitor 1 is adjusted.

Returning to FIG. 1, the calculation unit 2 is configured by a circuit including a field programmable gate array (FPGA), for example. The calculation unit 2 acquires parameters for calculating the impedance on the load 7 side or parameters for calculating the reflection coefficient on the load 7 side from the high frequency detection unit 6. The calculation unit 2 calculates and averages the impedance or the reflection coefficient on the load 7 side using these acquired parameters. The calculation unit 2 outputs the averaged impedance or reflection coefficient to the controller 3.

The controller 3 includes a central processing unit (CPU; not illustrated). The controller 3 controls the operation of each unit according to a control program stored in advance in a read only memory (ROM) and performs processing, such as input, output, operation, and time measurement. A computer program that defines the procedure of each process performed by the CPU may be loaded in advance into a random access memory (RAM) using means that is not illustrated. In this case, the loaded computer program may be executed by the CPU. Alternatively, the controller 3 may be configured by a microcomputer or a dedicated hardware circuit.

The controller 3 acquires the impedance or the reflection coefficient on the load 7 side that has been calculated by the calculation unit 2. In a case where the impedance on the load 7 side is acquired, the controller 3 determines the combination of the capacitors 11, 12, . . . , 18 of the variable capacitor 1 so that the impedance on the load 7 side matches the output impedance of the high frequency power supply 5. In a case where the reflection coefficient on the load 7 side is acquired, the controller 3 determines the combination of the capacitors 11, 12, . . . , 18 of the variable capacitor 1 so that the reflection coefficient at the input portion approaches 0. If the magnitude of the reflection coefficient falls within the allowable range, it is considered that impedance matching has been achieved. By such control, power is efficiently supplied from the high frequency power supply 5 to the load 7. The following description will be given on the assumption that the calculation unit 2 calculates the impedance on the load 7 side and the controller 3 calculates the capacitance of the variable capacitor 1 using the calculated impedance and determines the combination of the capacitors 11, 12, . . . , 18. The determined combination of the capacitors 11, 12, . . . , 18 corresponds to ON/OFF states to be taken by the PIN diodes 21, 22, . . . , 28.

The switch state setting unit 4 sets the ON/OFF states of the PIN diodes 21, 22, . . . , 28 according to the combination of the capacitors 11, 12, . . . , 18 determined by the controller 3, that is, ON/OFF states to be taken by the PIN diodes 21, 22, . . . , 28. In a case where the ON/OFF states of the PIN diodes 21, 22, . . . , 28 are set by the switch state setting unit 4, the above-described complementary driving signals are applied to each of the corresponding driving circuits 31, 32, . . . , 38. As a result, the ON/OFF states of the PIN diodes 21, 22, . . . , 28 of the variable capacitor 1 are newly controlled. Then, the capacitance of the variable capacitor 1 is adjusted to the capacitance calculated by the controller 3.

For example, in a case where the amplitude of the high frequency power supplied from the high frequency power supply 5 to the load 7 through the transmission line 101 is periodically modulated, the driving circuits 31, 32, . . . , 38 need to switch on or off the PIN diodes 21, 22, . . . , 28 respectively at high speed in synchronization with the modulation period. In this case, a phenomenon has been observed in which the PIN diode breaks down despite that loss derating is performed using a PIN diode having a sufficient withstand voltage. Therefore, the inventors have observed a current flowing through the PIN diode and a voltage applied to the PIN diode when switching on or off the PIN diode. Then, the inventors try to figure out a phenomenon occurring until the PIN diode breaks down.

Figure 3:
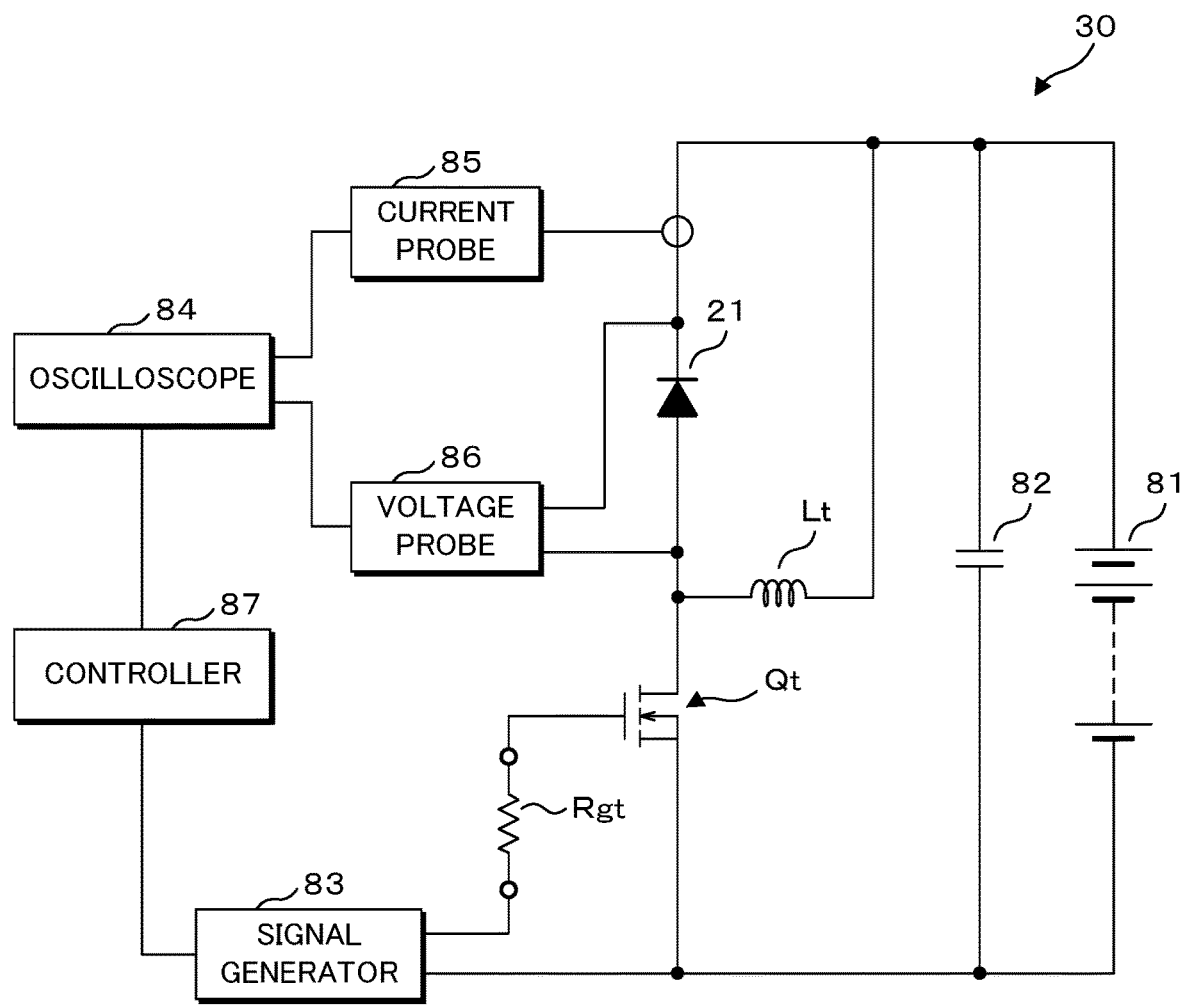
FIG. 3 is a block diagram illustrating the configuration of an application circuit that applies a forward voltage and a reverse voltage to a PIN diode.

FIG. 3 is a block diagram illustrating the configuration of an application circuit 30 that applies a forward voltage and a reverse voltage to the PIN diode 21. A cathode of PIN diode 21 to which a voltage is to be applied is connected to one end of an inductor Lt and a positive terminal of an application power supply 81. An anode of the PIN diode 21 is connected to the other end of the inductor Lt and the drain of a transistor Qt. The source of the transistor Qt is connected to the negative terminal of the application power supply 81. A bypass capacitor 82 is connected between the cathode of the PIN diode 21 and the source of the transistor Qt. A test signal is applied between the gate and the source of the transistor Qt, from a signal generator 83 through a resistor Rgt.

The voltage of the application power supply 81 is, for example, 1700 V. However, it is preferable that the voltage of the application power supply 81 approaches the absolute value of the voltage of the negative power supply V− illustrated in FIG. 2. In addition, it is preferable to insert a filter F on the anode side of the PIN diode 21 so that the application power supply 81 is close to the driving circuit 31 illustrated in FIG. 2. The inductance of the inductor Lt is, for example, 2.7 mH. The output impedance of the signal generator 83 is sufficiently smaller than the resistance value of the resistor Rgt.

A current probe 85 of an oscilloscope 84 is connected to a connection node between the cathode of the PIN diode 21 and the positive terminal of the application power supply 81. A voltage probe 86 of the oscilloscope 84 is connected to both ends of the PIN diode 21. The signal generator 83 and the oscilloscope 84 are connected to a controller 87 including a microcomputer that controls the measurement of the current and voltage of the PIN diode 21. The connection between the controller 87 and the oscilloscope 84 is realized, for example, by a general purpose interface bus (GPIB).

Figure 4:
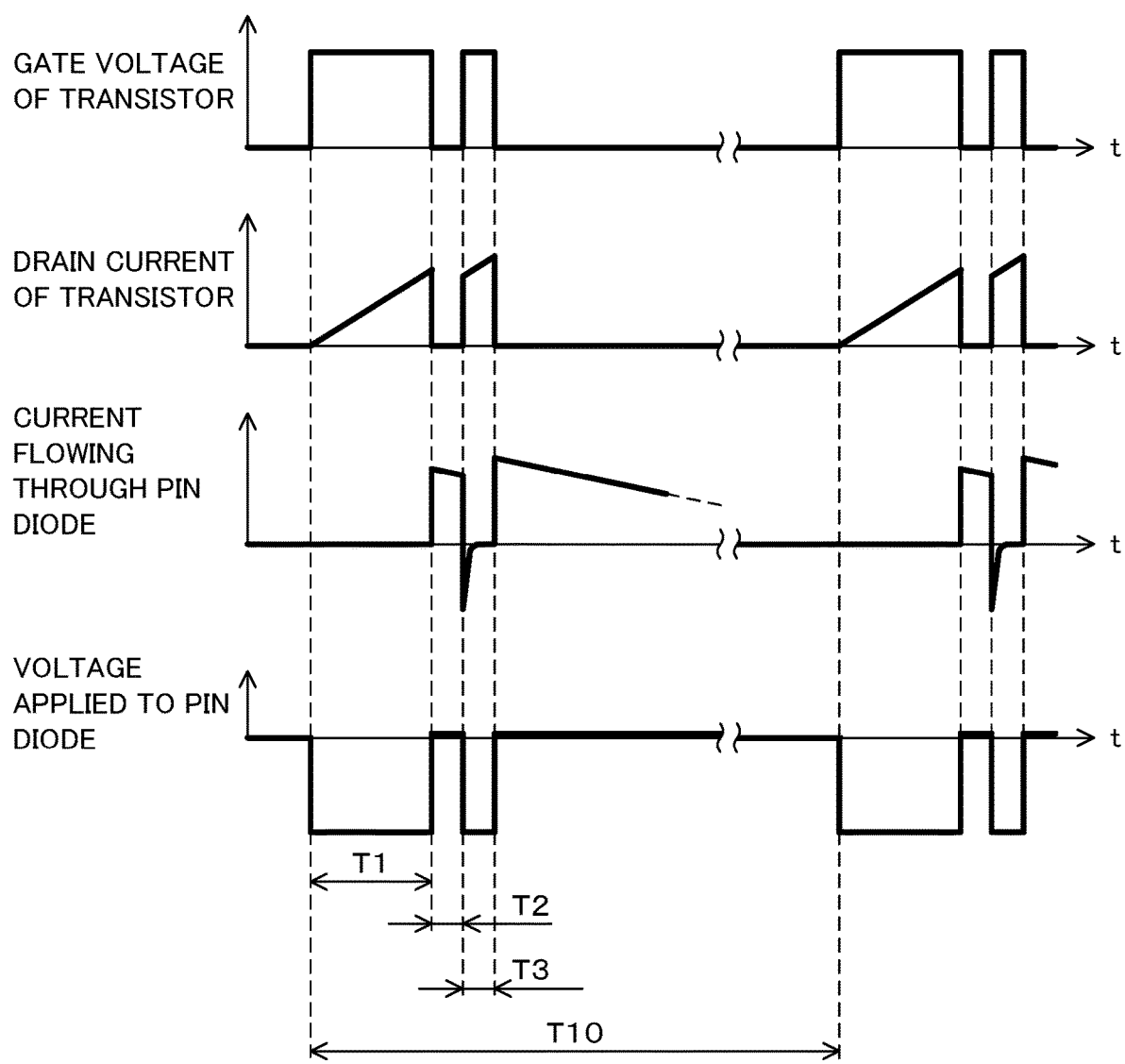
FIG. 4 is a timing chart schematically showing the voltage and current of each portion in the application circuit.

FIG. 4 is a timing chart schematically showing the voltage and current of each portion in the application circuit 30. The four timing charts shown in FIG. 4 have the same time axis (t) as their horizontal axes. In order from the top, the gate voltage of the transistor Qt, the drain current of the transistor Qt, the current flowing through the PIN diode 21, and the voltage applied to the PIN diode 21 are shown. Regarding the current flowing through the PIN diode 21, a forward current is a positive current. Regarding the voltage applied to the PIN diode 21, a forward voltage is a positive voltage.

The signal generator 83 generates a periodic test signal so that the gate voltage is applied to the transistor Qt only in periods T1 and T3 during one period corresponding to the length of a period T10. An interval corresponding to a period T2 is provided between the periods T1 and T3. The length of the period T10 is sufficiently longer than the lengths of the periods T1, T2, and T3. Therefore, the current flowing through the inductor Lt at the start of the period T1 is substantially zero (0).

In the period T1, the transistor Qt is ON so that the voltage of the application power supply 81 is applied to both ends of the inductor Lt and a linearly increasing current flows from the inductor Lt to the transistor Qt. The length of the period T1 is set such that the maximum value of the current is approximately the same as the value of the forward current flowing through the PIN diode 21 by the driving circuit 31 illustrated in FIG. 2. In the example of Embodiment 1, the current value is approximately 1 A. In addition, since no forward current flows through the PIN diode 21 immediately before the period T1, no reverse recovery current flows through the PIN diode 21 at the start of the period T1.

In the period T2, the current flowing from the inductor Lt to the transistor Qt at the end of the period T1 is commutated to the PIN diode 21 so that the forward current flows from the inductor Lt to the PIN diode 21 and returns to the inductor Lt. A forward voltage is applied to the PIN diode 21. During the period T2, the forward current attenuates slightly. The length of the period T2 is set to such a length that the amount of forward current attenuation during the period T2 can be neglected. In the example of Embodiment 1, the length of the period T2 is several µs.

In the period T3, the transistor Qt is ON again so that the voltage of the application power supply 81 is applied to both ends of the inductor Lt and a linearly increasing current flows to the inductor Lt. A reverse voltage corresponding to the voltage of the application power supply 81 is applied to the PIN diode 21 so that a reverse recovery current flows. The length of the period T3 is longer than the time during which the reverse recovery current is sufficiently attenuated. Furthermore, the length of the period T3 is a length realizing that the increment of the current flowing through the inductor Lt can be neglected. In the example of Embodiment 1, the length of the period T3 is about 1.4 µs.

After the end of the period T3, the current flowing from the inductor Lt to the transistor Qt is commutated again to the PIN diode 21 so that the forward current flows from the inductor Lt to the PIN diode 21 and returns to the inductor Lt. A forward voltage is applied to the PIN diode 21. The forward current and the forward voltage converge to zero until the end of the period T10.

In the application circuit 30, each time the resistance value of the resistor Rgt is changed, the controller 87 causes the signal generator 83 to generate a test signal and the current and voltage of the PIN diode 21 are measured. A resistor which changes the resistance value of the resistor Rgt is selected newly. The selected resistor may be connected in series to the gate circuit by a human hand as the new resistor Rgt. Alternatively, the controller 87 may select a resistor among a plurality of resistors. In this case, the controller 87 controls switching an electronic switch (not illustrated) so that the selected resistor is connected in series to the gate circuit as the new resistor Rgt. Regarding the current and voltage of the PIN diode 21, the waveforms of the current and voltage displayed on the oscilloscope 84 may be measured by a human eye. Alternatively, data of the current value and the voltage value generated by the oscilloscope 84 may be acquired and measured by the controller 87.

Figure 5:
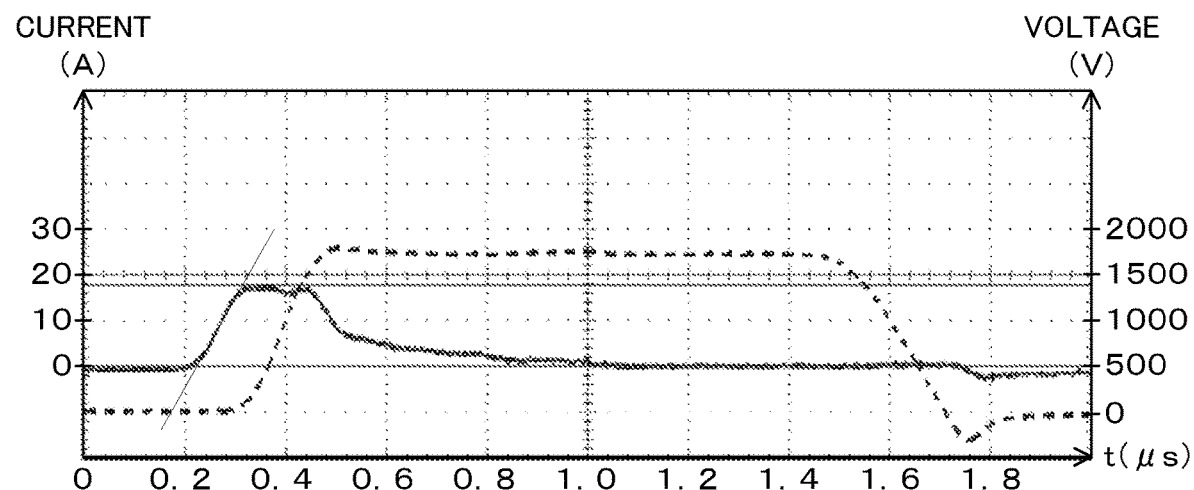
FIG. 5 is a waveform diagram showing an example of current and voltage waveforms displayed on an oscilloscope.
Figure 5:
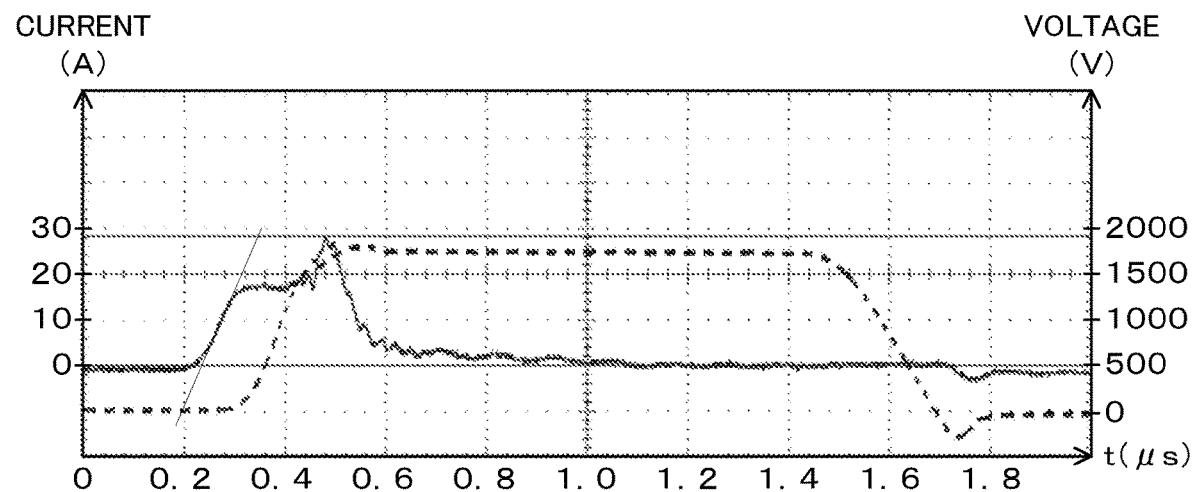

FIG. 5 is a waveform diagram showing an example of current and voltage waveforms displayed on the oscilloscope 84. The two waveform diagrams shown in FIG. 5 have the same time axis (t) as their horizontal axes. The upper part of the diagram shows a waveform of a case where the reverse recovery current of the PIN diode 21 rises relatively slowly. The lower part of the diagram shows a waveform of a case where the reverse recovery current of the PIN diode 21 rises at a relatively high speed. In FIG. 5, the solid line indicates a current and the broken line indicates a voltage. It is noted that the directions of the current and voltage of the PIN diode 21 shown in FIG. 5 are reversed from the directions of the current and voltage of the PIN diode 21 shown in FIG. 4. Regarding the current flowing through the PIN diode 21, a reverse recovery current is a positive current. Regarding the voltage applied to the PIN diode 21, a reverse voltage is a positive voltage.

Hereinafter, the numerical values on the horizontal axis will be described as time. In the upper waveform diagram of FIG. 5, the reverse recovery current starts to rise around time 0.20 µs and reaches a peak around time 0.32 µs. The reverse recovery current attenuates without reaching the second peak. It is noted that a peak due to simple ringing or noise in this case are not considered as the second peak. Thereafter, a forward current (current on the negative side in FIG. 5) starts to flow around time 1.73 µs. On the other hand, the reverse voltage starts to rise around time 0.30 µs and reaches a peak around time 0.50 µs. Then, the reverse voltage starts to fall around time 1.46 µs and the voltage is switched from the reverse voltage to the forward voltage (voltage on the negative side in FIG. 5) around time 1.71 µs. As described above, in a case where the second peak does not appear regarding the reverse recovery current, the PIN diode 21 does not break down even if ON/OFF switching of the PIN diode 21 is repeatedly performed.

In the lower waveform diagram of FIG. 5, the reverse recovery current starts to rise around time 0.20 µs, reaches a peak around time 0.32 µs, further reaches a second peak illustrating a clear maximum value around time 0.48 µs, and then attenuates. Thereafter, a forward current starts to flow around time 1.71 µs. On the other hand, the reverse voltage starts to rise around the time 0.30 µs, the waveform starts to be distorted around the time 0.46 µs. The reverse voltage reaches a peak around the time 0.52 µs. Then, the reverse voltage starts to fall around time 1.44 µs. The voltage is switched from the reverse voltage to the forward voltage around time 1.69 µs. As described above, in a case where the second peak appears regarding the reverse recovery current, a phenomenon has been observed in which the PIN diode 21 breaks down while repeating ON/OFF switching of the PIN diode 21.

In the waveform diagram of FIG. 5, a diagonal line indicating the maximum slope of the reverse recovery current rise is shown. The maximum slope of the reverse recovery current rise corresponds to the maximum value of the increase rate of the absolute value of the current. In the case where the resistor Rgt is relatively small so that the reverse recovery current rises at a relatively high speed, that is, in the case of the lower waveform diagram, the second peak appears in the current waveform shown in FIG. 5. The rise of the reverse recovery current at the relatively high speed means that the slope of the diagonal line in the diagram is relatively steep. Therefore, the inventors have measured the increase rate of the absolute value of the reverse recovery current of the PIN diode 21. Hereinafter, the increase rate of the absolute value of the reverse recovery current of the PIN diode 21 will be simply referred to as an increase rate. A threshold value is set to an increase rate smaller than the maximum value of the increase rate of the case where the second peak appears in the current waveform. The resistance value of the resistor Rgt is determined so that the actual increase rate is smaller than the set threshold value.

In the application circuit 30 illustrated in FIG. 3 and the driving circuit 31 illustrated in FIG. 2, the same PIN diode 21 is used. Therefore, the threshold value determined by using the application circuit 30 can also be applied to the driving circuit 31 illustrated in FIG. 2. In a case where it is necessary to switch on or off the PIN diode 21 as quickly as possible, the resistance value of the resistor Rgt is determined so that the determined threshold value matches the maximum value of the actual increase rate. In a case where it is assumed that the operating conditions of the PIN diode 21 are the same in the application circuit 30 illustrated in FIG. 3 and in the driving circuit 31 illustrated in FIG. 2, the resistance value of the resistor Rgt determined by using the application circuit 30 may be applied to the resistance value of the resistor Rg2 of the driving circuit 31 illustrated in FIG. 2. The resistance value of the resistor Rg2 determined in this manner is larger than the resistance value of the resistor Rg1.

In Embodiment 1, the threshold value is set to a value that is less than 1 time and 0.5 times or more of the maximum value of the increase rate of the case where the second peak appears in the waveform of the reverse recovery current. The threshold value is not limited to the above-mentioned value. The maximum value is 0.26 A/ns in the waveform diagram shown in the lower part of FIG. 5. Therefore, in Embodiment 1, the threshold value is set to 0.13 A/ns, for example. The lower the threshold value, the greater the margin for the conditions in which the PIN diode 21 breaks down, but it becomes difficult to switch on or off the PIN diode 21 at high speed. In addition, in the case where the threshold value is low, the resistance values of the resistors Rg1 and Rg2 illustrated in FIG. 2 become more unbalanced so that so-called dead time adjustment becomes difficult. Hereinafter, operations of the calculation unit 2 and a controller 87 described above will be described with reference to the flowchart illustrating the operations.

Figure 6:
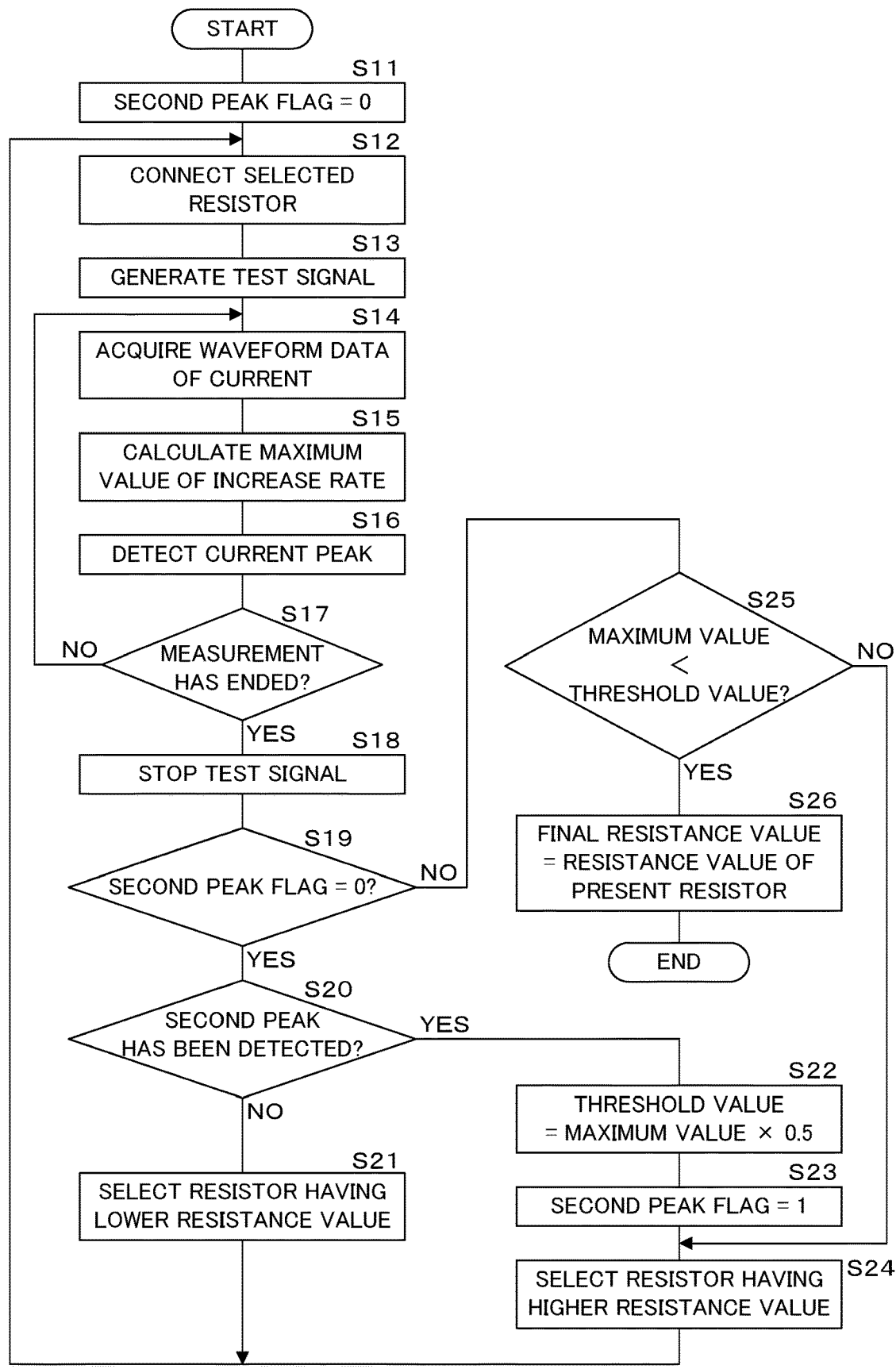
FIG. 6 is a flowchart illustrating the processing procedure of a controller that determines a threshold value of an increase rate of an absolute value of a reverse recovery current.

FIG. 6 is a flowchart illustrating the processing procedure of the controller 87 that determines the threshold value of the increase rate of the absolute value of the reverse recovery current. The process of FIG. 6 starts in a timely manner when starting a test for determining the threshold value. The second peak flag shown in FIG. 6 is a flag indicating that the second peak has been detected in the waveform of the reverse recovery current. The resistor shown in FIG. 6 corresponds to the resistor Rgt. The resistor having a resistance value that clearly illustrates that the second peak does not appear in the reverse recovery current is initially selected as the resistor Rgt in advance. The current shown in FIG. 6 indicates the reverse recovery current of the PIN diode 21.

The driving circuit 31 and the switch state setting unit 4 illustrated in FIG. 2 and the controller 3 illustrated in FIG. 1 are used instead of the application power supply 81, the bypass capacitor 82, the inductor Lt, and the transistor Qt in the application circuit 30 illustrated in FIG. 3. Even in this case, the above threshold value can be determined. In the case where the driving circuit 31, the switch state setting unit 4, and the controller 3 are used, the cathode of the PIN diode 21 is grounded, and the oscilloscope 84 is connected to the controller 3. The controller 3 also has the function of the signal generator 83. Herein, the test signals for turning on or off the transistors QH and QL are not limited to those shown in FIG. 4. Also in the case where the driving circuit 31, the switch state setting unit 4, and the controller 3 are used, the controller 3 can use the processing procedure of FIG. 6.

In a case where the process illustrated in FIG. 6 is started, first, the controller 87 initializes the second peak flag to 0 (S11). The controller 87 connects the selected resistor Rgt in series to the gate circuit of the transistor Qt (S12), and causes the signal generator 83 to generate a test signal (S13). Then, the controller 87 acquires waveform data of the current from the oscilloscope 84 (S14), and measures the waveform. The controller 87 calculates the maximum value of the increase rate of the absolute value of the current (S15), and detects the current peak (S16). The calculation of the maximum value of the increase rate and the detection of the current peak are performed while the controller 87 repeats the processing from steps S14 to S16.

Thereafter, the controller 87 determines whether or not the measurement of the current waveform has ended (S17). In a case where the measurement has not ended (S17: NO), the controller 87 shifts the processing to step S14 so as to continue the measurement. The determination regarding whether or not the measurement has ended is based on, for example, determination regarding whether or not one period of the test signal shown in FIG. 4 has ended or determination regarding whether or not a plurality of predetermined periods have ended. In a case where the measurement is repeated over a plurality of periods of the test signal, the average value, the median value, or the mode value is adopted for each of the peak and second peak of the maximum value of the increase rate. In a case where the measurement has ended (S17: YES), the controller 87 causes the signal generator 83 to stop the test signal (S18), and determines whether or not the second peak flag is 0 (S19).

In a case where the second peak flag is 0 (S19: YES), that is, in a case where the detection of the second peak is not stored yet, the controller 87 determines whether or not the second peak (that is, the second peak of the current) has been detected in step S16 (S20). In a case where the second peak has not been detected yet (S20: NO), the controller 87 selects the resistor Rgt having a lower resistance value (S21), and shifts the processing to step S12 so as to start the next measurement.

In a case where the controller 87 determines that the second peak has been detected (S20: YES), the controller 87 determines a value, which is obtained by multiplying the maximum value calculated in step S15 by 0.5, as a threshold value (S22), and sets the second peak flag to 1 (S23). As a result, the detection of the second peak is stored. Then, the controller 87 selects the resistor Rgt having a higher resistance value (S24), and shifts the processing to step S12.

In a case where the second peak flag is not 0 (S19: NO), that is, in a case where the detection of the second peak is stored, the controller 87 determines whether or not the maximum value newly calculated in step S15 is smaller than the threshold value determined in step S22 (S25). In a case where the maximum value is smaller than the threshold value (S25: YES), the controller 87 determines the resistance value of the present resistor Rgt as a final resistance value (S26), and ends the process illustrated in FIG. 6. In a case where the maximum value newly calculated in step S15 is not smaller than the threshold value (S25: NO), the controller 87 shifts the processing to step S24 so as to select the resistor Rgt having a higher resistance value.

In the processing procedure described above, focusing on the reverse recovery current, the threshold value is determined, and the final resistance value of the resistor Rgt is determined. However, in a case where an overshoot occurs regarding the reverse voltage of the PIN diode 21, the threshold value may be further reduced until the overshoot is eliminated. In this case, the final resistance value of the resistor Rgt is further increased. In a case where the resistance value of the resistor Rg2 illustrated in FIG. 2 is determined based on the determined threshold value, in order to reduce the influence of unbalance between the resistance values of the resistors Rg1 and Rg2, a series circuit in which another resistor and a diode are connected in series may be connected in parallel to the resistor Rg2. Thereby, the fall of the transistor QL accelerates. In this case, an anode of the diode faces the gate of the transistor QL.

As described above, according to Embodiment 1, the forward voltage is applied to the PIN diode 21 through the transistor QH. The reverse voltage is applied to the PIN diode 21 through the transistor QL. The increase rate of the absolute value of the reverse recovery current flowing through the PIN diode 21 when the voltage applied to the PIN diode 21 is changed from the forward voltage to the reverse voltage is limited to a value smaller than a threshold value determined within the range of less than 1 time and 0.5 times or more of the increase rate of the case where the second peak appears regarding the reverse recovery current. As a result, the increase rate of the absolute value of the reverse recovery current is suppressed to a value smaller than a value that causes the PIN diode 21 to break down. Therefore, it is possible to perform ON/OFF driving of the PIN diode 21 without the PIN diode 21 breaking down.

In addition, according to Embodiment 1, the PIN diode 21 is connected, through the filter F, to the connection node between the transistor QL and the series circuit in which the transistor QH is connected in series to the resistor R1. Therefore, the forward current of the PIN diode 21 is limited by the resistor R1 so that the accumulation of minority carrier is suppressed. In addition, it is possible to suppress a high frequency voltage applied from the transmission line 101 to the transistor QH and the transistor QL.

In addition, according to Embodiment 1, the reverse voltage is applied to the PIN diode 21 through the transistor QL. The resistor Rg2 is connected in series to the gate circuit of the transistor QL. The increase rate of the absolute value of the reverse recovery current of the PIN diode 21 is suppressed according to the magnitude of the resistance value of the resistor Rg2. Therefore, the increase rate of the absolute value of the reverse recovery current can be easily adjusted.

In addition, according to Embodiment 1, the application circuit 30 applies a forward voltage to the PIN diode 21 and applies a reverse voltage to PIN diode 21 through the transistor Qt. The PIN diode 21 is connected to the application circuit 30. The transistor Qt is turned on and off alternately each time the resistors Rgt having different resistance values are individually connected to the gate circuit of the transistor Qt one by one. Then, the waveform of the reverse recovery current is measured. Regarding the reverse recovery current of a case where the second peak appears in the measured waveform, a value that is less than 1 time and 0.5 times or more of the maximum value of the increase rate of the absolute value is set as the threshold value of the increase rate. Therefore, it is possible to calculate a threshold value for driving the PIN diode 21 at high speed close to the limit speed which does not cause the PIN diode 21 to break down.

(Modification 1)

In Embodiment 1, the cathodes of the PIN diodes 21, 22, . . . , 28 are grounded. In Modification 1, the anodes of the PIN diodes 21, 22, . . . , 28 are grounded. The block configuration of the impedance matching device according to Modification 1 is different from that illustrated in FIG. 1 of Embodiment 1 only in the directions of the PIN diodes 21, 22, . . . , 28. Specifically, anodes of the PIN diodes 21, 22, . . . , 28 are grounded and cathodes of the PIN diodes 21, 22, . . . , 28 are connected to the driving circuits 31, 32, . . . , 38 respectively. In addition, the same reference numerals are given to portions corresponding to Embodiment 1, and the description thereof will be omitted.

Figure 7:
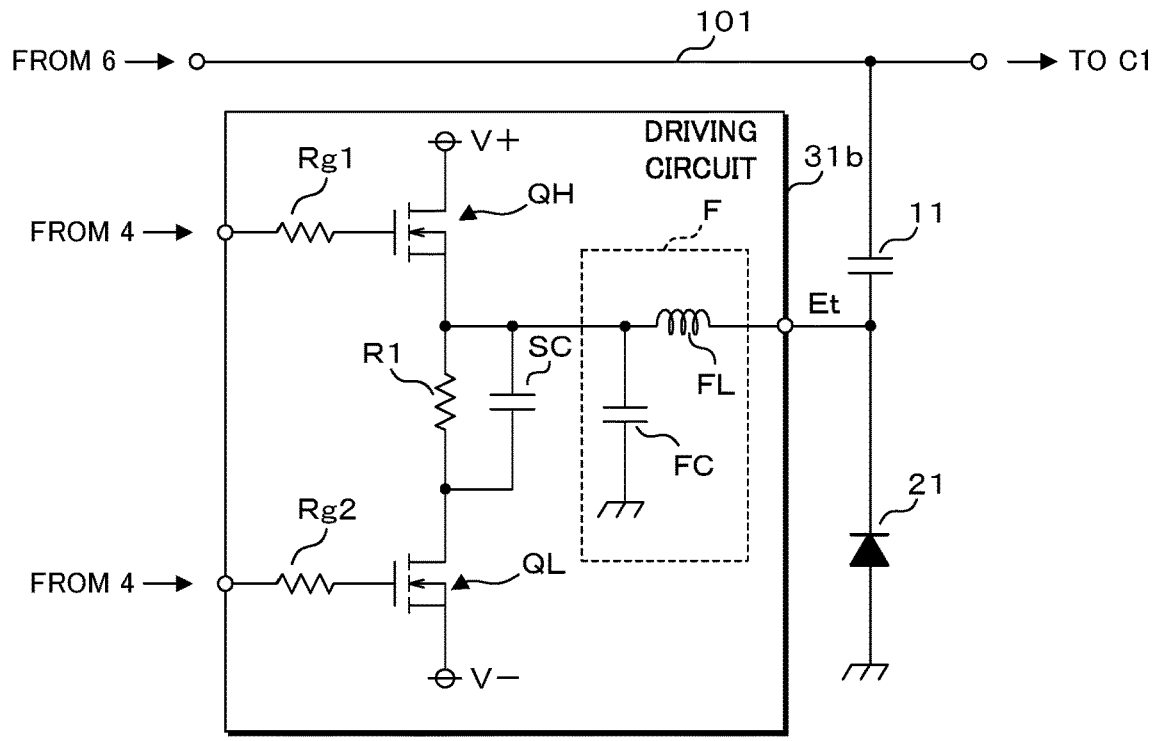
FIG. 7 is a circuit diagram illustrating a configuration example of a driving circuit according to Modification 1.
Figure 7:
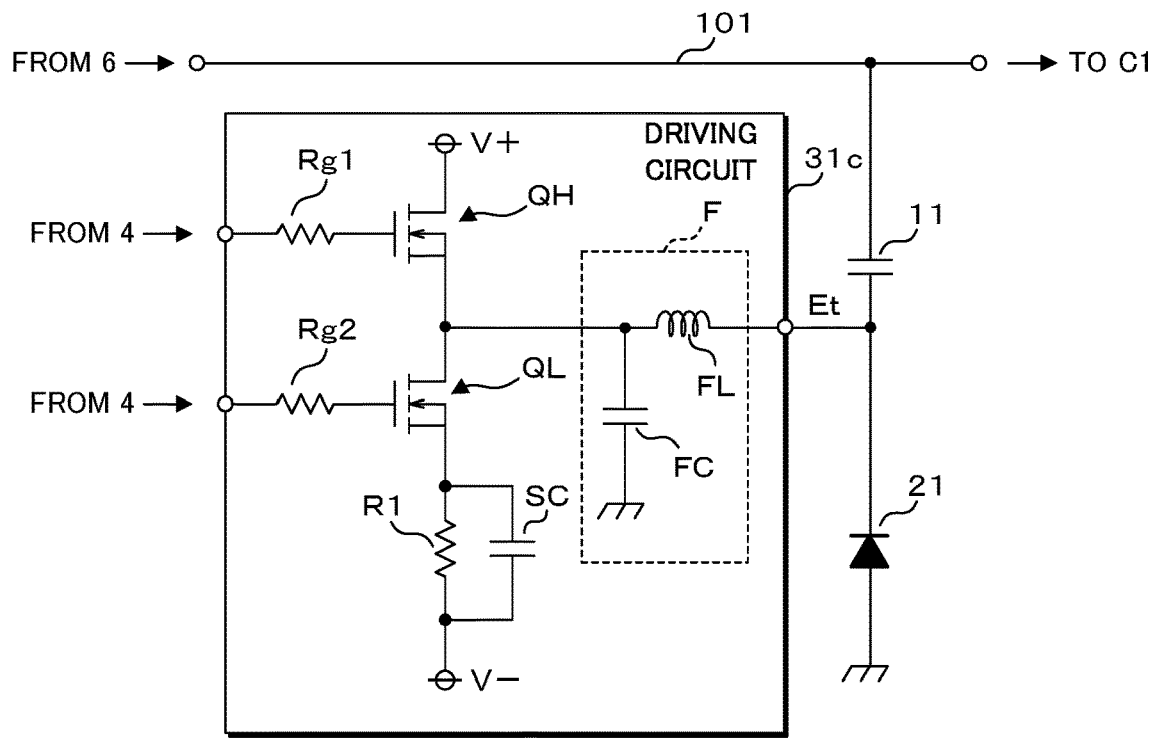

FIG. 7 is a circuit diagram illustrating a configuration example of each of driving circuits 31b and 31c according to Modification 1. The driving circuit 31b illustrated in the upper part of FIG. 7 is different from the driving circuit 31 illustrated in FIG. 2 of Embodiment 1 in the connection destination of the connection node between the inductor FL and the capacitor FC in the filter F. In the driving circuit 31 of Embodiment 1, the connection node is connected to the drain of the transistor QL. In the driving circuit 31b of Modification 1, the connection node is connected to the source of the transistor QH.

The driving circuit 31c illustrated in the lower part of FIG. 7 is different from the driving circuit 31b illustrated in the upper part of FIG. 7 in the connection location of the parallel circuit in which the resistor R1 and the speed-up capacitor SC are connected in parallel. In the driving circuit 31b in the upper part of FIG. 7, the parallel circuit is connected to the drain side of the transistor QL. In the driving circuit 31c in the lower part FIG. 7, the parallel circuit is connected to the source side of the transistor QL. The driving circuits 31b and 31c are different only in the connection order of the transistor QL and the parallel circuit so that there is no significant difference in the configuration viewed from the PIN diode 21. In practice, there is a difference in the potential of the driving signal applied to the gate of the transistor QL. However, there is no difference in the operation itself of the transistor QL.

According to the driving circuit 31b, the forward current of the PIN diode 21 flows to the negative power supply V− through the filter F, the parallel circuit, and the transistor QL. The parallel circuit includes the resistor R1 and speed-up capacitor SC. In the case where the absolute value of the voltage output from the positive power supply V+ illustrated in FIG. 2 of Embodiment 1 is same as the absolute value of the voltage output from the negative power supply V− illustrated in FIG. 7, there is no difference in the magnitude of the forward current. Similarly, in the case where absolute value of the voltage output from the negative power supply V− illustrated in FIG. 2 of Embodiment 1 is same as the absolute value of the voltage output from the positive power supply V+ illustrated in FIG. 7, there is no difference in the magnitude of the reverse recovery current flowing through the PIN diode 21.

As described above, Modification 1 has the similar effect as the case of Embodiment 1 apparently.

(Modification 2)

In Embodiment 1 the increase rate of the absolute value of the reverse recovery current of each of the PIN diodes 21, 22, . . . , 28 is limited based on the magnitude of the resistance value of the resistor Rgt connected in series to the gate circuit of the transistor QL. In Modification 2, the increase rate of the absolute value of the reverse recovery current is limited based on the quality of the transient characteristics of the filter F. The block configuration of the impedance matching device 100 according to Modification 2 is same as that illustrated in FIG. 1 of Embodiment 1. The configuration of the driving circuit 31 according to Modification 2 is same as that illustrated in FIG. 2 of Embodiment 1. Therefore, the same reference numerals are given to portions corresponding to Embodiment 1, and the description thereof will be omitted. Hereinafter, the driving circuit 31 of the PIN diode 21 will be described.

The reverse recovery current of the PIN diode 21 flows to the transistor QL through the filter F (refer to FIG. 2). Therefore, the rise of the reverse recovery current can be delayed by intentionally deteriorating the transient characteristics of the filter F. In a case where the capacitance of the capacitor FC is constant, the inductance of the inductor FL may be increased, for example. By repeating such adjustment, the threshold value of the increase rate of the absolute value of the reverse recovery current can be determined similarly as in the case of Embodiment 1.

In the case of determining the above-described threshold value using the application circuit 30 illustrated in FIG. 3 of Embodiment 1, the filter F is inserted on the anode side of the PIN diode 21. The increase rate of the absolute value of the reverse recovery current is measured each time the inductors FL having different inductances are applied to the filter F one by one. In the case of determining the threshold value of the increase rate of the absolute value of the reverse recovery current in accordance with the processing procedure illustrated in FIG. 6 of Embodiment 1, processing for performing a connection of selected inductor FL in the filter F is performed in step S12 of FIG. 6. In step S21, inductor FL having a smaller inductance is selected. In step S24, the inductor FL having a larger inductance is selected. In addition, in step S26, the final inductance is determined as the inductance of the present inductor FL.

As described above, according to Modification 2, the increase rate of the absolute value of the reverse recovery current of the PIN diode 21 is suppressed based on the quality of the transient characteristics of the low pass filter F. Specifically, the increase rate of the absolute value of the reverse recovery current is reduced by lowering the cutoff frequency of the filter F. Therefore, the increase rate of the absolute value of the reverse recovery current can be easily adjusted.

(Modification 3)

In Embodiment 1, the increase rate of the absolute value of the reverse recovery current of each of the PIN diodes 21, 22, . . . , 28 is limited based on the magnitude of the resistance value of the resistor Rgt connected in series to the gate circuit of the transistor QL. In Modification 3, the increase rate of the absolute value of the reverse recovery current is limited based on a resistor R3 connected in series to the drain circuit of the transistor QL. The block configuration of the impedance matching device 100 according to Modification 3 is the same as that illustrated in FIG. 1 of Embodiment 1. Therefore, the same reference numerals are given to portions corresponding to Embodiment 1, and the description thereof will be omitted. Hereinafter, a driving circuit 31d of the PIN diode 21 will be described.

Figure 8:
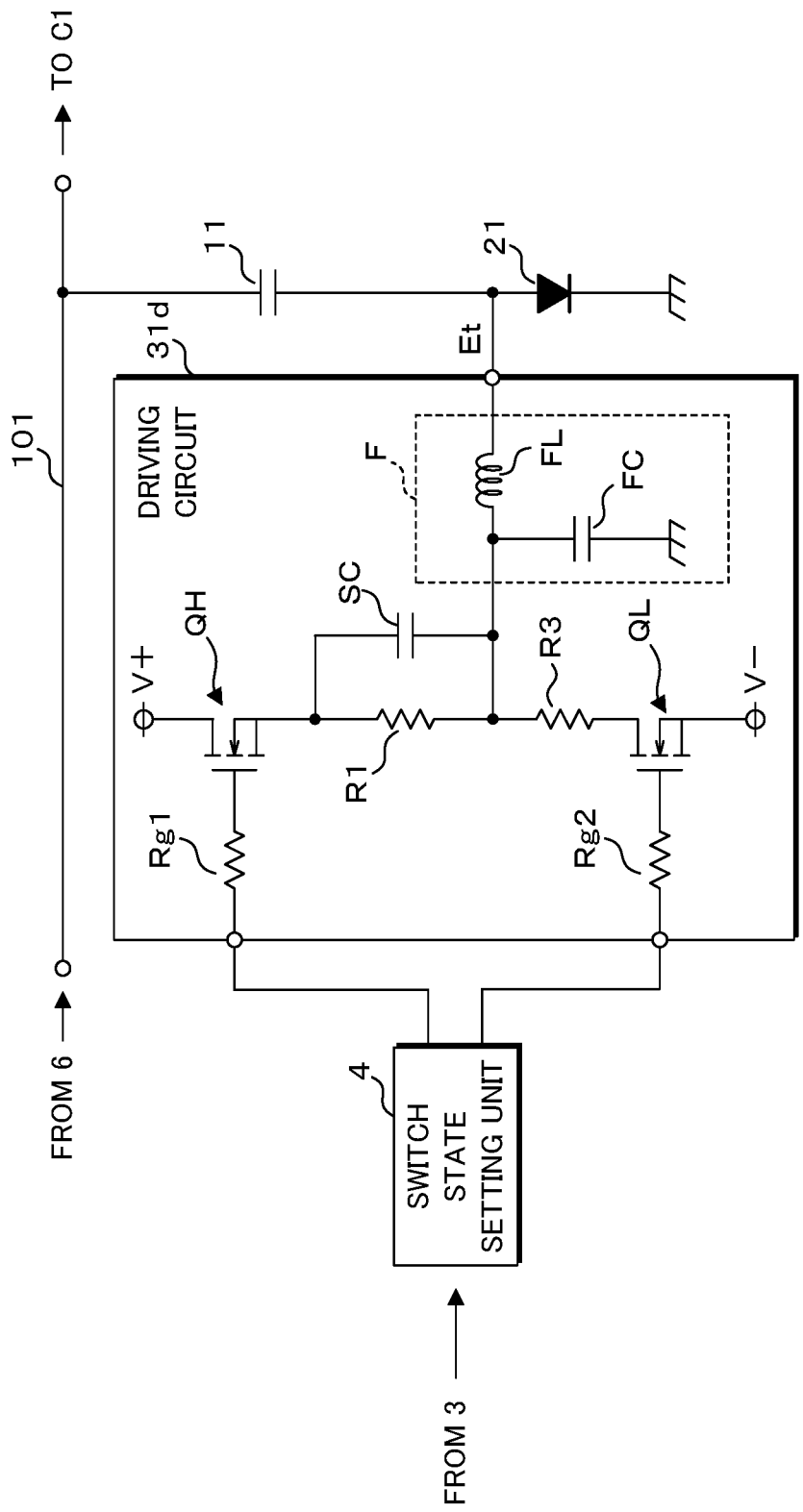
FIG. 8 is a circuit diagram illustrating a configuration example of a driving circuit according to Modification 3.

FIG. 8 is a circuit diagram illustrating a configuration example of the driving circuit 31d according to Modification 3. In a case where the driving circuit 31d is compared with the driving circuit 31 illustrated in FIG. 2 of Embodiment 1, in the driving circuit 31d, the resistor R3 is connected in series to the drain circuit of the transistor QL. That is, the resistor R3 is connected between the drain of the transistor QL and the parallel circuit in which the resistor R1 and the speed-up capacitor SC are connected in parallel. The other configuration of the driving circuit 31d is the same as that of the driving circuit 31. The description of the other configuration of the driving circuit 31d will be omitted.

In the driving circuit 31d, the reverse recovery current of the PIN diode 21 flows to the negative power supply V− through the filter F, the resistor R3, and the transistor QL.

The resistance value of the resistor R3 is increased. Thereby, the rise of the reverse recovery current can be delayed based on the relationship between the resistor R3 and the filter F.

In the case of determining the above-described threshold value using the application circuit 30 illustrated in FIG. 3 of Embodiment 1, the resistor R3 is connected in series to the drain side of the transistor Qt. The increase rate of the absolute value of the reverse recovery current is measured each time the resistors R3 having different resistance values are connected to the drain circuit of the transistor Qt one by one. In the case of determining the threshold value of the increase rate of the absolute value of the reverse recovery current in accordance with the processing procedure illustrated in FIG. 6 of Embodiment 1, processing for connecting the selected resistor R3 to the drain circuit of the transistor Qt is performed in step S12 of FIG. 6. In step S21, the resistor R3 having a smaller resistance value is selected. In step S24, the resistor R3 having a large resistance value is selected. In addition, in step S26, the final resistance value is determined as the resistance value of the present resistor R3.

As described above, according to Modification 3, the resistor R3 is connected between the transistor QL and the series circuit in which the transistor QH and the resistor R1 are connected in series. The PIN diode 21 is connected, through the filter F, to the connection node between the resistor R3 and the series circuit in which the transistor QH and the resistor R1 are connected in series. Then, the increase rate of the absolute value of the reverse recovery current of the PIN diode 21 is suppressed according to the magnitude of the resistance value of the resistor R3. Therefore, the increase rate of the absolute value of the reverse recovery current can be easily adjusted.

It is noted that, as used herein and in the appended claims, the singular forms "a", "an", and "the" include plural referents unless the context clearly dictates otherwise.

It should be considered that the embodiments disclosed this time are examples in all points and not restrictive. The scope of the invention is defined by the claims rather than the meanings set forth above, and is intended to include all modifications within the scope and meaning equivalent to the claims. In addition, the technical features described in the embodiments can be combined with each other.

What is claimed is:

1. A PIN diode driving circuit, comprising:
   a first switching element through which a forward voltage is applied to a PIN diode;
   a second switching element through which a reverse voltage is applied to the PIN diode; and
   a limiting unit that limits an increase rate of an absolute value of a reverse recovery current to a value smaller than a threshold value, the reverse recovery current flowing through the PIN diode when a voltage applied to the PIN diode changes from a forward voltage to a reverse voltage by switching of the fist switching element and the second switching element,
   wherein the threshold value is less than 1 time and 0.5 times or more of a maximum value of the increase rate of a case where a second peak appears regarding the reverse recovery current.

2. The PIN diode driving circuit according to claim 1, further comprising:
   a series circuit in which the first switching element is connected in series to a first resistor for limiting a forward current flowing through the PIN diode; and a low pass filter, wherein one end of the series circuit is connected to one end of the second switching element, and wherein the low pass filter is provided between one end of the PIN diode and a connection node between the series circuit and the second switching element, and prevents a high frequency voltage, which is applied to the one end of the PIN diode from outside, from being applied to the first switching element and the second switching element.

3. The PIN diode driving circuit according to claim 1, wherein the second switching element is a transistor having an insulated gate, and wherein the limiting unit is a second resistor connected in series to a gate circuit of the transistor.

4. The PIN diode driving circuit according to claim 2, wherein the low pass filter has transient characteristics limiting the increase rate to the value smaller than the threshold value, and wherein the limiting unit is the low pass filter.

5. The PIN diode driving circuit according to claim 2, wherein the limiting unit is a third resistor connected between one end of the series circuit and one end of the second switching element.

6. A threshold value determination method for determining a threshold value of an increase rate of an absolute value of a reverse recovery current flowing through a PIN diode when a voltage applied to the PIN diode changes from a forward voltage to a reverse voltage, comprising:

connecting the PIN diode to an application circuit in which, in a case where a switching element having an insulate gate is turned on and off alternately, a reverse voltage is applied to the PIN diode through the switching element after a forward voltage is applied to the PIN diode;

turning on and off the switching element alternately each time one of a plurality of resistors having different resistance values is connected in series to a gate circuit of the switching element;

measuring a waveform of the reverse recovery current; and setting a value, which is less than 1 time and 0.5 times or more of a maximum value of the increase rate of a case where a second peak appears in the measured waveform, as the threshold value.

* * * * *